United States Patent
Granneman et al.

(10) Patent No.: US 7,410,355 B2
(45) Date of Patent: Aug. 12, 2008

(54) METHOD FOR THE HEAT TREATMENT OF SUBSTRATES

(75) Inventors: Ernst H. A. Granneman, Hilversum (NL); Vladimir I. Kuznetsov, Ultrecht (NL); Xavier Pages, St Marcellin (FR); Pascal G. Vermont, Almere (NL); Herbert Terhorst, Amersfoort (NL); Gert-Jan Snijders, Amersfoort (NL)

(73) Assignee: ASM International N.V. (NL)

( * ) Notice: Subject to any disclaimer, the term of this patent is extended or adjusted under 35 U.S.C. 154(b) by 226 days.

(21) Appl. No.: 11/356,697

(22) Filed: Feb. 17, 2006

(65) Prior Publication Data
US 2006/0141808 A1    Jun. 29, 2006

Related U.S. Application Data

(63) Continuation-in-part of application No. 10/700,298, filed on Oct. 31, 2003, now Pat. No. 7,022,627.

(51) Int. Cl.
H01L 21/02    (2006.01)
(52) U.S. Cl. .................... 432/5; 432/247; 438/799; 118/725; 219/490
(58) Field of Classification Search ............... 432/5, 432/6, 249, 247; 118/724, 725; 438/795, 438/799, 928; 219/444.1, 490, 494, 497, 219/502
See application file for complete search history.

(56) References Cited

U.S. PATENT DOCUMENTS

| | | | |
|---|---|---|---|
| 3,947,236 A | 3/1976 | Lasch, Jr. | |
| 4,495,024 A | 1/1985 | Bok | |
| 4,560,590 A | 12/1985 | Bok | |
| 4,575,408 A | 3/1986 | Bok | |
| 4,738,748 A | 4/1988 | Kisa | |
| 4,860,687 A | 8/1989 | Frijlink | |
| 4,975,561 A | 12/1990 | Robinson et al. | |
| 5,178,639 A | 1/1993 | Nishi | |
| 5,180,273 A | 1/1993 | Sakaya et al. | |
| 5,314,848 A | 5/1994 | Yasui et al. | |
| 5,332,442 A | 7/1994 | Kubodera et al. | |
| 5,407,449 A | 4/1995 | Zinger | |

(Continued)

FOREIGN PATENT DOCUMENTS

JP    61294812 A    12/1986

(Continued)

OTHER PUBLICATIONS

Porter, et al., Fast-ramp rapid vertical processor for 300-mm Si wafer processing. SPIE vol. 3507, Sep. 1998, p. 42-53.

*Primary Examiner*—Gregory A Wilson
(74) *Attorney, Agent, or Firm*—Knobbe, Martens, Olson & Bear LLP

(57) ABSTRACT

A substrate undergoes a semiconductor fabrication process at different temperatures in a reactor without changing the temperature of the reactor. The substrate is held suspended by flowing gas between two heated surfaces of the reactor. Moving the two heated surfaces in close proximity with the substrate for a particular time duration heats the substrate to a desired temperature. The desired temperature is then maintained by distancing the heated surfaces from the substrate and holding the heated surface at the increased distance to minimize further substrate heating.

27 Claims, 12 Drawing Sheets

U.S. PATENT DOCUMENTS

| | | |
|---|---|---|
| 5,411,076 A | 5/1995 | Matsunaga et al. |
| 5,414,244 A | 5/1995 | Imahashi |
| 5,430,271 A | 7/1995 | Orgami et al. |
| 5,431,700 A | 7/1995 | Sloan |
| 5,464,313 A | 11/1995 | Ohsawa |
| 5,650,082 A | 7/1997 | Anderson |
| 5,772,770 A * | 6/1998 | Suda et al. .................. 118/719 |
| 5,790,750 A | 8/1998 | Anderson |
| 5,855,681 A | 1/1999 | Maydan et al. |
| 5,997,588 A | 12/1999 | Goodwin et al. |
| 6,001,175 A | 12/1999 | Maruyama et al. |
| 6,018,616 A | 1/2000 | Schaper |
| 6,064,799 A | 5/2000 | Anderson et al. |
| 6,072,163 A | 6/2000 | Armstrong et al. |
| 6,080,969 A | 6/2000 | Goto et al. |
| 6,097,005 A | 8/2000 | Akimoto |
| 6,099,056 A | 8/2000 | Siniaguine et al. |
| 6,111,225 A | 8/2000 | Ohkase et al. |
| 6,183,565 B1 | 2/2001 | Granneman et al. |
| 6,207,936 B1 | 3/2001 | de Waard et al. |
| 6,215,106 B1 | 4/2001 | Boas et al. |
| 6,234,788 B1 | 5/2001 | Lee |
| 6,275,744 B1 | 8/2001 | Yoshida |
| 6,329,304 B1 | 12/2001 | Kuznetsov et al. |
| 6,394,797 B1 * | 5/2002 | Sugaya et al. ............... 432/253 |
| 6,887,803 B2 * | 5/2005 | Yoo .......................... 438/795 |
| 2003/0027094 A1 | 2/2003 | Storm et al. |
| 2003/0092231 A1 | 5/2003 | Granneman et al. |
| 2003/0209200 A1 | 11/2003 | Kuznetsov et al. |
| 2003/0209327 A1 | 11/2003 | Kuznetsov et al. |

FOREIGN PATENT DOCUMENTS

| | | |
|---|---|---|
| JP | 62021237 A | 1/1987 |
| JP | 63136532 | 8/1988 |
| JP | 02034915 A | 2/1990 |
| JP | 04078130 A | 3/1992 |
| JP | 08236533 | 9/1996 |
| JP | 10321505 | 12/1998 |
| WO | WO 90/13687 | 11/1990 |
| WO | WO 98/01890 | 1/1998 |
| WO | WO 00/42638 | 7/2000 |
| WO | WO 00/68977 | 11/2000 |

* cited by examiner

METHOD FOR THE HEAT TREATMENT OF SUBSTRATES

REFERENCE TO RELATED APPLICATIONS

This application is a continuation-in-part of U.S. patent application Ser. No. 10/700,298, filed Oct. 31, 2003 now U.S. Pat. No. 7,022,627.

In addition, this application is related to U.S. application Ser. No. 10/151,207, METHOD AND DEVICE FOR THE HEAT TREATMENT OF SUBSTRATES, filed May 16, 2002; U.S. application Ser. No. 10/186,269, METHOD AND APPARATUS FOR THE TREATMENT OF SUBSTRATES, filed Jun. 27, 2002; U.S. application Ser. No. 10/141,517, TEMPERATURE CONTROL FOR SINGLE SUBSTRATE SEMICONDUCTOR PROCESSING REACTOR, filed May 8, 2002; and U.S. application Ser. No. 10/410,699, TEMPERATURE CONTROL FOR SINGLE SUBSTRATE SEMICONDUCTOR PROCESSING REACTOR, filed Apr. 8, 2003.

BACKGROUND OF THE INVENTION

1. Field of the Invention

This invention relates generally to semiconductor processing and, more particularly, to the heat treatment of substrates, including semiconductor wafers or flat panel displays.

2. Description of the Related Art

Reactors which can process a substrate while suspending or floating the substrate without directly mechanically contacting the substrate, e.g., by floating the substrate on gas cushions, have relatively recently been developed for semiconductor processing. These reactors may be called floating substrate reactors and such a reactor is commercially available under the trade name Levitor® from ASM International, N.V. of Bilthoven, The Netherlands.

In the Levitor® reactor, which is also described in U.S. Pat. No. 6,183,565 B1, a substrate, such as a wafer, is supported by two opposite gas flows emanating from two heated and relatively massive reactor blocks located on opposite sides of the substrate. The boundary surfaces of the reactor blocks facing the wafer are substantially flat and a small gap of less than about 1 mm is typically maintained between each block and the corresponding wafer surface. The small gap results in a particularly rapid heat transfer from the heated blocks to the wafer by conduction through the gas. The heat-up of the wafer is thus very uniform, as the wafer is not mechanically contacted during the heat treatment. In comparison, where a transport arm transports a substrate into the reactor and then continues to support the substrate during processing, mechanical contact during processing by support fingers of a transport arm results in cold spots on the wafer during heat-up at the contact positions with the support fingers, as the support fingers represent extra thermal mass that needs to be heated and that locally slows down the heat-up rate. Alternatively, where a substrate is transported to the reactor and then handed off to support pins that remain in the reactor after processing, mechanical contact during processing by those support pins results in hot spots on the wafer at the contact positions when the wafer is handed-off and contacts the support pins. Also, by floating a substrate during processing, thermal stresses, possibly resulting in crystallographic slip, are advantageously avoided.

A method utilizing a floating substrate reactor, such as the Levitor® reactor, to achieve a high degree of reproducibility in the thermal treatment for a series of substrates, which are successively treated one by one, is described in U.S. Patent Application Publication No. 2003/0027094 A1, published Feb. 6, 2003, and assigned to ASM International, N.V. In that method, the temperature is measured close to the boundary surface of a reactor block so that withdrawal of heat from the reactor block by the placement of a relatively cold substrate in the reactor is measured at that boundary surface. The reactor block is typically continuously heated and the cold substrate is placed in the vicinity of the reactor block only after the reactor block has reached a desired temperature, as measured at the boundary surface. The cold substrate typically will absorb heat and reduce the temperature of the reactor block. The substrate is then removed after processing and before the temperature of the continuously heated reactor block rises to the desired temperature again. After the temperature of the reactor block rises to the desired temperature, another substrate is placed in the vicinity of the reactor block.

An advantage of reactors such as the Levitor® reactor is that the relatively massive reactor blocks of the reactor act as thermal "fly-wheels," resulting in a very stable temperature and reproducible performance. Ideally, for the most efficient operation, the reactor has a constant temperature set-point all the time.

Different process requirements, however, may require different treatment temperatures. From a semiconductor fabrication operation point of view and the standpoint of process efficiency, one thermal treatment reactor should be able to perform these different processes. However, changing the temperature of reactors such as the Levitor® reactor, and cooling-down the reactor, in particular, is a very time-consuming process that can negatively influence the applicability of such a reactor for performing sequences of processes requiring different process temperatures.

Accordingly, it is an object of the present invention to provide an improved method for thermally treating a substrate in a floating substrate reactor at different temperatures.

SUMMARY OF THE INVENTION

According to one aspect of the invention, a method is provided for the thermal treatment of a planar substrate. The method comprises providing a reactor having one or more furnace bodies, the one or more furnace bodies each having a substantially flat boundary surface. The one or more furnace bodies are heated to a predetermined furnace body temperature. The substrate is placed adjacent to and essentially parallel to the one or more furnace bodies such that a planar surface of the substrate faces the boundary surface of each of the one or more furnace bodies. The substrate is kept adjacent to the boundary surface of each of the one or more furnace bodies during a heat-up time to allow the substrate to heat up to a substrate temperature, wherein the substrate temperature is less than the furnace body temperature by about 20° C. or more. Subsequently, the substrate is removed from the substrate from the reactor while the substrate temperature is still less than the furnace body temperature of each of the one or more furnace bodies by about 20° C. or more.

According to another aspect of the invention, a method is provided for thermally treating a substrate. The method comprises providing a first heated surface at a first temperature and a second heated surface at a second temperature, where the first heated surface is positioned facing the second heated surface. A substrate is also provided between the first and the second heated surfaces. The substrate is heated to a desired substrate temperature, which is less than the first and the second temperatures. The transference of heat between the substrate and the first and the second surfaces is reduced after heating the substrate to the desired substrate temperature. The reduction in heat transference occurs without reducing the set-point temperature for the first surface or the set-point temperature for the second surface. After reducing the transference of heat, the substrate is maintained between the first and the second heated surfaces to perform a semiconductor fabrication process.

According to yet another aspect of the invention, a method is provided for semiconductor processing. The method comprises conductively heating a first thermal treatment substrate in a reactor to a first thermal treatment temperature by positioning the first thermal treatment substrate in close proximity to a heated reactor surface. The first thermal treatment temperature is less than the temperature of the heated surface. The first thermal treatment substrate is then substantially maintained at the first thermal treatment temperature for a first holding period in the reactor. The method further comprises conductively heating a second thermal treatment substrate in the reactor to a second temperature higher than the first thermal treatment temperature by positioning the first thermal treatment substrate in close proximity to the heated reactor surface. The second thermal treatment substrate is then substantially maintained at the second temperature for a second holding period in the reactor. The reactor itself is configured to conductively heat only one substrate at a time. It will be understood that the second treatment can precede or succeed the first treatment.

According to another aspect of the invention, a heat treatment apparatus for processing a plurality of substrates. The apparatus comprises two furnace bodies which are opposite each other and separated by a separation distance. Each furnace body has a boundary surface oriented to face a substrate upon positioning of the substrate in the heat treatment apparatus for heat treatment. The furnace bodies are movable relative to each other. Each furnace body also has a furnace body temperature. The apparatus also comprises one or more heaters configured to heat each furnace body to its furnace body temperature. The apparatus is configured to be able to treat a substrate at either a first treatment temperature or a second treatment temperature, where the heater has a substantially constant set-point during treatment whether the substrate is at the first treatment temperature or the second treatment temperature.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE INVENTION

Figure 1:
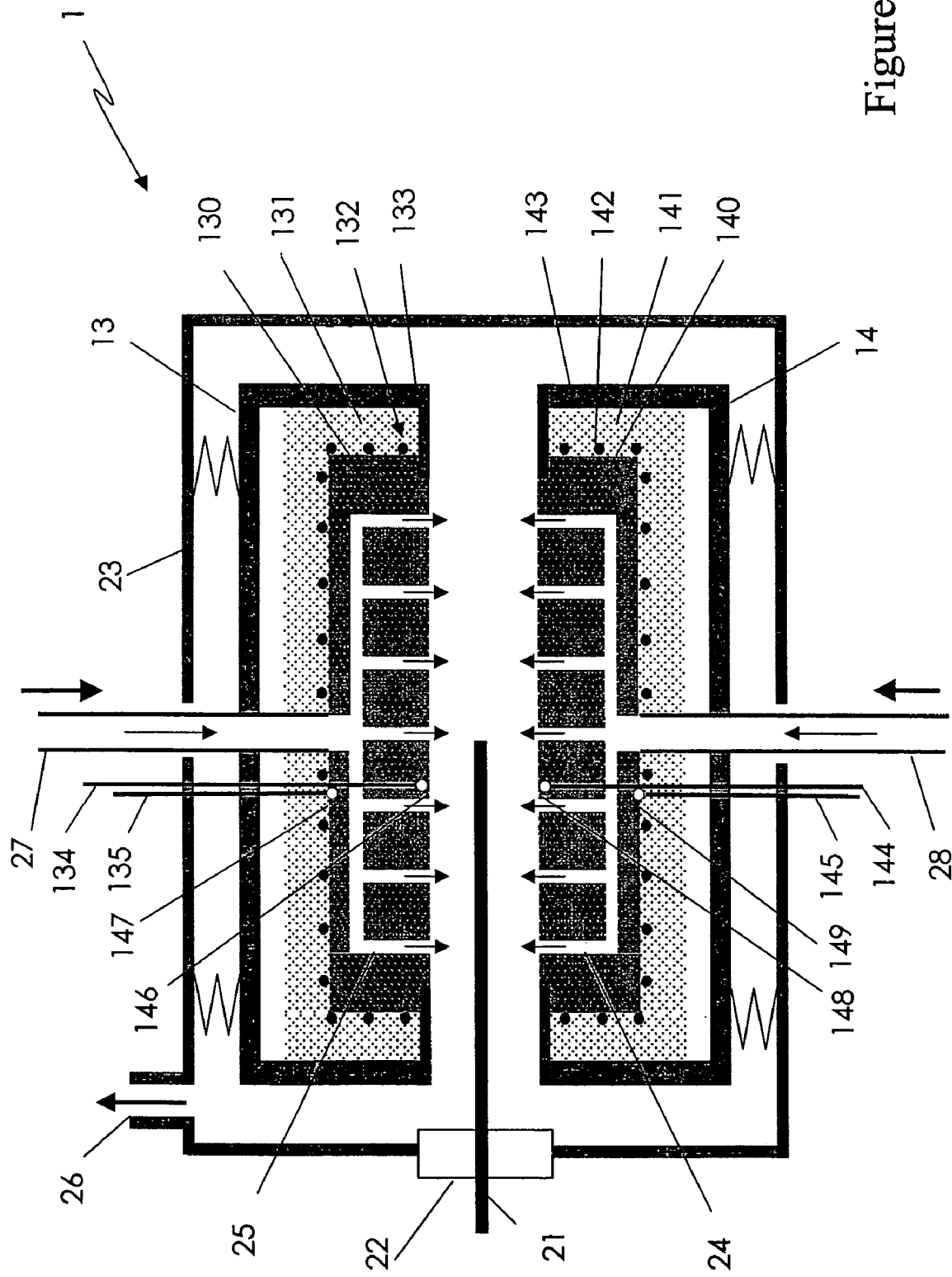
FIG. 1 shows, diagrammatically, the loading of a substrate into an exemplary floating substrate reactor, with the reactor shown in an open position, in accordance with preferred embodiments of the invention.

According to preferred embodiments of the invention, a method is provided for processing a substrate at different temperatures without needing to change the temperature set-point of the reactor in which processing occurs. Rather than altering the temperature of the reactor, the temperature of the substrate is controlled by varying the amount of heat energy received by the substrate. In the illustrated embodiments, the substrate is positioned in close proximity with at least one heated body or surface of the reactor and heating to a desired temperature is accomplished by, e.g., holding the substrate in close proximity with the heated surface for a predetermined time. Preferably, there are two heated bodies, also referred to as furnace bodies, facing each other and the substrate is positioned between the two heated bodies. Heating preferably principally occurs by heat conducted from the heated bodies to the substrate through a process gas and to a lesser extent by radiation. After being heated to the desired temperature, the heat energy received by the substrate is decreased to minimize further heating of the substrate and, preferably, to prevent the substrate from significantly deviating from the desired temperature.

In one preferred exemplary embodiment, the decrease in thermal conduction occurs by increasing the distance between the substrate and the heated bodies. In another preferred exemplary embodiment, the decrease in thermal conduction is brought about by decreasing the thermal conductivity of the process gas, with or without increasing the distance between the substrate and the heated bodies. In some embodiments, the temperature of the heated bodies and the increased distance and/or the thermal conductivity of the process gas are chosen such that the temperature of the substrate is relatively stable when the heat energy transferred to the substrate is decreased. Advantageously, the decrease in thermal conductivity allows the substrate to undergo a semiconductor fabrication process, such as an anneal, at a reduced temperature relative to the furnace bodies during the time when the substrate is positioned between the furnace bodies.

Preferably, processing of the substrate at the decreased temperature is just one of two or more processes or process steps to be performed in the reactor. In such embodiments, the temperature of the heated bodies is preferably set at the temperature of the highest temperature process, e.g., an anneal. The temperature of the lower temperature processes can preferably be achieved by use of low thermal conduction between the substrate and the heated bodies for a hold time after the initial heat-up time, while the temperature of the higher temperature process can be achieved by maintaining high thermal conduction between the substrate and the heated bodies during that entire process step, e.g., by having a relatively small separation between the substrate and the heated bodies or by flowing a relatively high thermal conductivity gas between the substrate and the heated bodies. Preferably, the substrate is heated to about the temperature of the heated bodies during the highest temperature process. Thus, by varying the heat transferred to the substrate, the substrate can be processed at varying temperatures without requiring that the temperature of the reactor itself be changed, providing flexibility to use the tool.

Reference will now be made to the Figures, wherein like numerals refer to like parts throughout.

While the preferred embodiments can be applied to other reactors known to those of skill in the art, use of a floating substrate reactor is particularly advantageous. For example, the reactor design illustrated in FIGS. 1-3 does not require that a substrate 21 be mechanically supported during processing; that is, the substrate 21 can be processed without being directly contacted by a solid support. This enables very uniform and rapid heating of the substrate 21 without the cold spots that can occur in reactors where substrates are mechanically contacted during a semiconductor fabrication process. In addition, the upper and lower blocks 13 and 14 of the reactor 1 surrounding the substrate are preferably relatively massive such that each has a high heat capacity relative to the substrate 21, helping to stabilize the temperature of the substrate and minimizing the susceptibility of the reactor 1 to temperature fluctuations upon loading and unloading of the substrate 21 into the reactor 1. The basic configuration of the reactor 1 is available commercially under the trade name Levitor® from ASM International, N.V. of The Netherlands.

Figure 2:
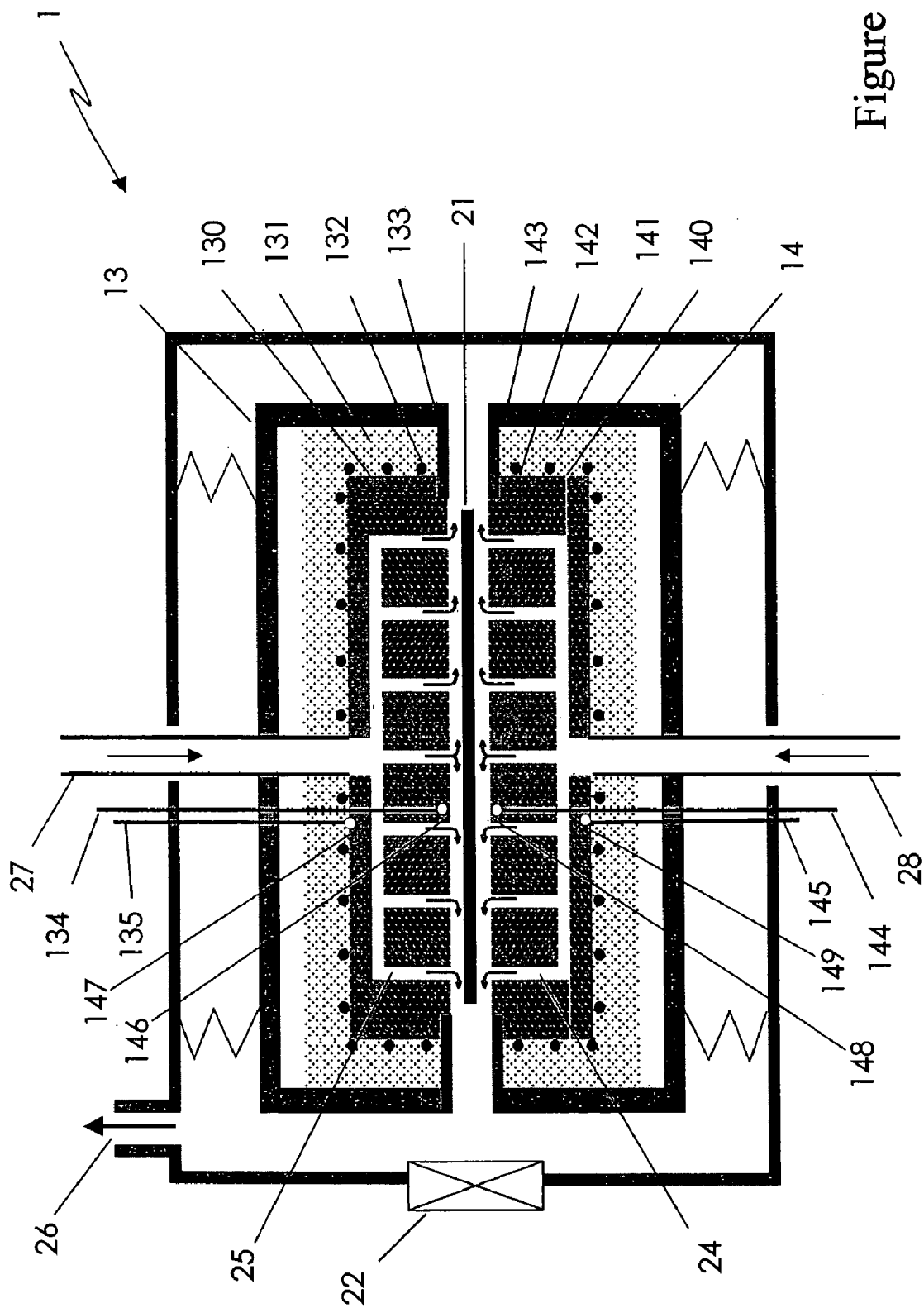
FIG. 2 shows, diagrammatically, the treatment of a substrate in an exemplary floating substrate reactor, with the reactor shown in a closed position, in accordance with preferred embodiments of the invention.
Figure 3:
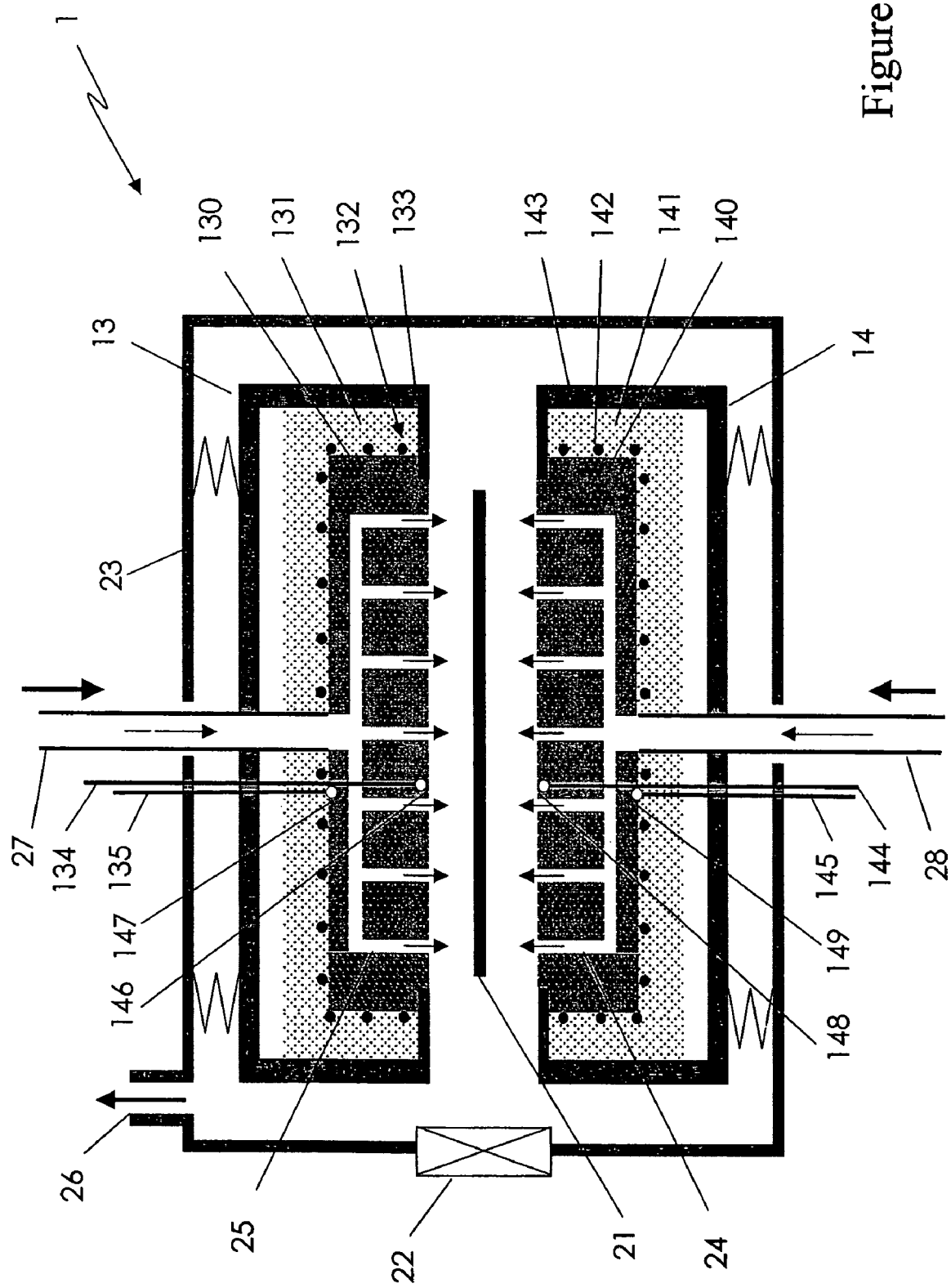
FIG. 3 shows, diagrammatically, the treatment of a substrate in an exemplary floating substrate reactor, with the reactor shown in an open position, in accordance with preferred embodiments of the invention.

As shown in FIGS. 1 to 3, the heat treating apparatus of the reactor 1 includes an upper block 13 and a lower block 14 that are in a housing 23. As shown in FIG. 1, the housing 23 is preferably provided with a flap 22 that can be opened for loading and subsequently removing a substrate 21. The lower block 14 and the upper block 13 can be moved towards one another by lifting rods 27 and 28. Alternatively, only one of the blocks is moveable.

The upper block 13 is made up of a upper furnace body 130, an insulating jacket 131, a heating coil 132 arranged on the inside of the insulating jacket 131, and an outer jacket 133. Similarly, the lower block 14 is made up of a lower furnace body 140, an insulating jacket 141, a heating coil 142 arranged on the inside of the insulating jacket 141, and an outer jacket 143. Preferably, each furnace body 130, 140 has a mass greater than 10 times the mass of a substrate for which the reactor is designed to accommodate, more preferably greater than 40 times the substrate mass.

The upper furnace body 130 is preferably provided with at least one temperature sensor 134 and the lower furnace body 140 is preferably also provided with at least one temperature sensor 144. As described above, in one preferred arrangement, the temperature sensors 134, 144 are arranged to measure temperatures close to the surfaces 146 and 148 of the furnace bodies 130, 140 that are adjacent to the substrate 21.

In another arrangement, the upper furnace body 130 is also provided with a second temperature sensor 135 that is arranged close to the side 147 of the upper furnace body 130 that faces away from the substrate 21. In a similar manner, the lower furnace body 140 can be provided with a second temperature sensor 145 arranged close to the side 149 of the lower furnace body 140 that faces away from the substrate 21. Process gases (including inert gases) are supplied both from the upper furnace body 130 through openings 25 and the lower furnace body 140 through openings 24. The gases can be discharged through a discharge opening 26 formed in the reactor housing 23.

The upper block 13 and the lower block 14 are preferably moved apart before introducing the substrate 21 into the reactor 1, as shown in FIG. 1. After the substrate 21 has been introduced into the reactor 1, the blocks 13 and 14 are moved towards one another by lifting rods 27 and 28 in such a way that the distance between the substrate and the adjacent surfaces 146 and 148 of the furnace bodies 130 and 140, respectively, is preferably less than about 2 mm and more preferably less than about 1 mm. In the illustrated embodiment, as shown in FIG. 2, the substrate is held in a stable position by gas streams issuing from the openings 24 and 25, without requiring further mechanical support. It will be appreciated, however, that in other arrangements, support structures such as support pins can be used to support and space the substrate from the bodies 130 and 140. Moreover, while illustrated as being symmetrically spaced from the bodies 130 and 140, the substrate 21 can be spaced closer to one or the other of the bodies 130 or 140 in other arrangements.

With reference to FIG. 2, the substrate 21 is heated rapidly after the blocks 13 and 14 are moved towards one another to a closed position, with the substrate 21 accommodated between them. According to one preferred embodiment, the substrate 21 and the blocks 13 and 14 are held in these relative positions for only a short heat-up time. Preferably, during the heat-up time, the substrate 21 is only partially heated-up; that is, the heat-up time is not long enough for the substrate 21 be heated to the temperature of the furnace bodies 130 and 140, so that, at the end of the heat-up time, the temperature of the substrate 21 is still lower and, preferably substantially lower (e.g., by greater than about 10° C.), than the temperature of the furnace bodies 130 and 140. It will be appreciated that the furnace bodies 130 and 140 can be at different temperatures, in which case the temperature of the substrate 21 is preferably lower than the temperatures of both the bodies 130 and 140. More preferably, the temperatures of the bodies 130 and 140 are approximately equal. After the heat-up time, the temperature of the substrate 21 is preferably less than the higher of the temperatures of the bodies 130 and 140 by about 20° C. or more, more preferably, by about 50° C. or more and, most preferably, by about 100° C. or more. Advantageously, by heating the substrate 21 to these levels or to even lower temperatures than those indicated by these levels, substrate heating can be more rapid than if the block(s) were set at the desired substrate temperate and the temperature of the substrate 21 can be adequately maintained when the thermal conduction between the substrate 21 and the bodies 130 and 140 is decreased, as discussed below.

As shown in FIG. 3, after the heat-up time, the blocks 13 and 14 are preferably moved away from each other and the distance between the substrate 21 and the adjacent surfaces 146 and 148 of the furnace bodies 130 and 140, respectively, increases again. After moving the blocks 13 and 14 away from each other, the substrate 21 can immediately be transferred out from between the blocks 13 and 14 to a cool-down position for cooling. Alternatively, the substrate 21 can be held between the blocks 13 and 14 while they are in the moved apart or open position for an additional hold time before transferring the substrate 21 out from between the blocks 13 and 14 to a cool-down position. During this hold time the substrate 21 may further heat up slightly. However, heat transfer by conduction is inversely proportional to the length of the heat conduction path. By increasing the distance between the substrate 21 and the furnace bodies 130 and 140, the heat transfer between the substrate 21 and furnace bodies 130 and 140 decreases.

Figure 4:
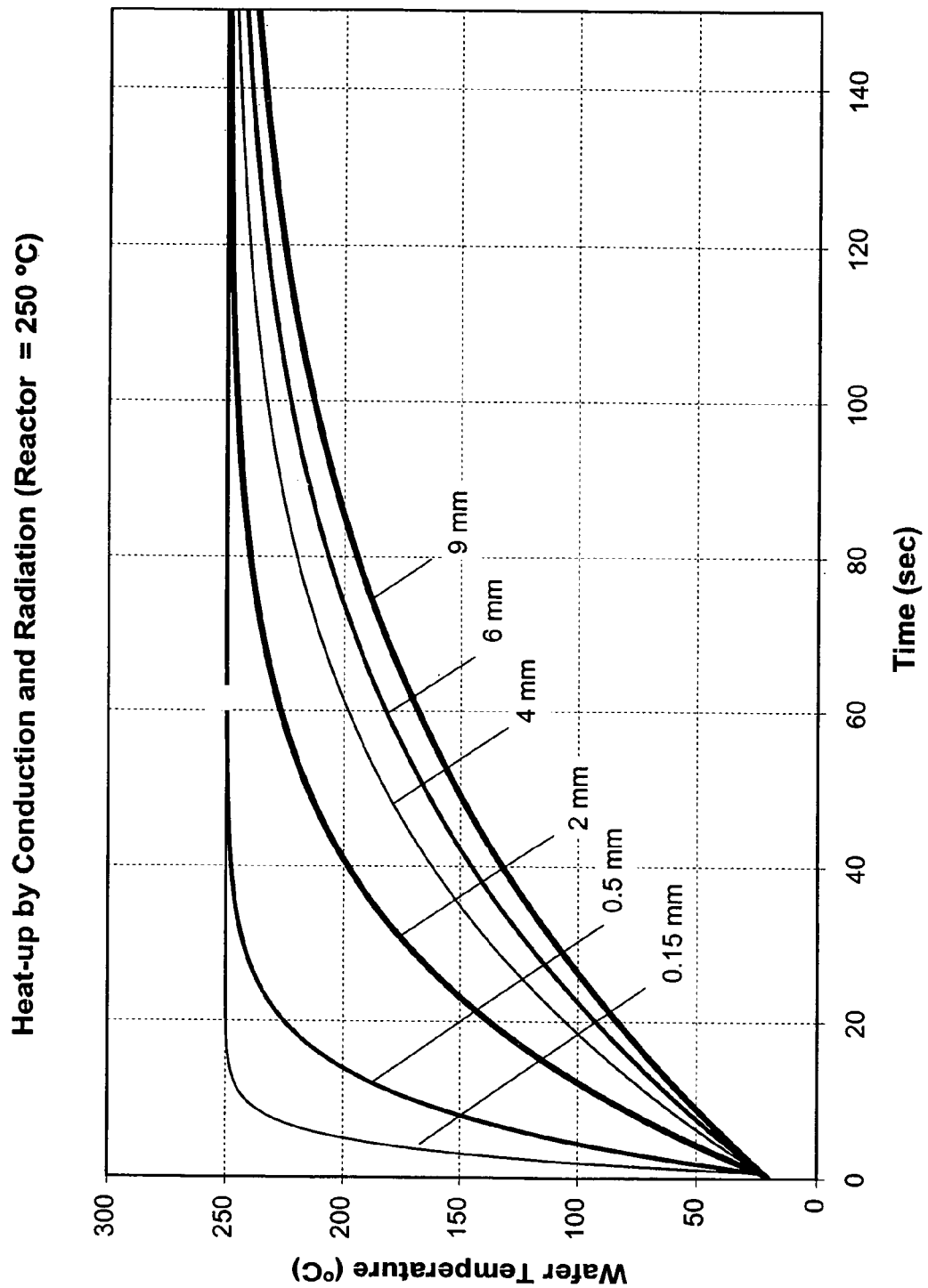
FIG. 4 shows the calculated heat-up of a substrate placed symmetrically between two reactor bodies maintained at 250° C., at various reactor body-to-substrate spacings.

The effect of terminating the heat-up of a substrate, in particular, a wafer, before the wafer reaches the temperature of the heated furnace bodies in a reactor such as that shown in FIGS. 1-3 has been calculated and the results are shown in FIGS. 4 to 7. In particular, FIG. 4 shows the results of a simulation of the heat-up of a silicon wafer when it is placed in a floating substrate reactor. In particular, the wafer is placed between and parallel to two furnace bodies having planar boundary surfaces facing opposite planar surfaces of the wafer. Heat-up curves were simulated for a wafer placed equidistantly between the two furnace bodies at a number of different distances, ranging from about 0.15 to 9 mm.

In the simulation, heat transfer by both radiation and conduction through the gas present between the wafer and the furnace bodies is taken into account. The gas in the simulation is nitrogen at atmospheric pressure. Heat transfer by conduction from the furnace body to the wafer is proportional to the temperature difference between the furnace body and the wafer and inversely proportional to the length of the conduction path, i.e., the distance between the wafer and the furnace body. Hence, for small distances the heat transfer by conduction is very high. As heat transfer by radiation is proportional to the fourth power of the temperature, at relatively low furnace body temperatures, e.g., below 600° C., the heat transfer by radiation is relatively low.

At t=0 the distance between the wafer and each of the furnace bodies is about 9 mm for all simulations. From t=0 to t=1 s the distance between the wafer and the furnace bodies is reduced, if applicable, by moving the furnace bodies toward each other. It can be seen from FIG. 4 that, for the larger distances, even after 120 seconds the substrate temperature still significantly deviates from the furnace body temperature of 250° C.

Figure 5:
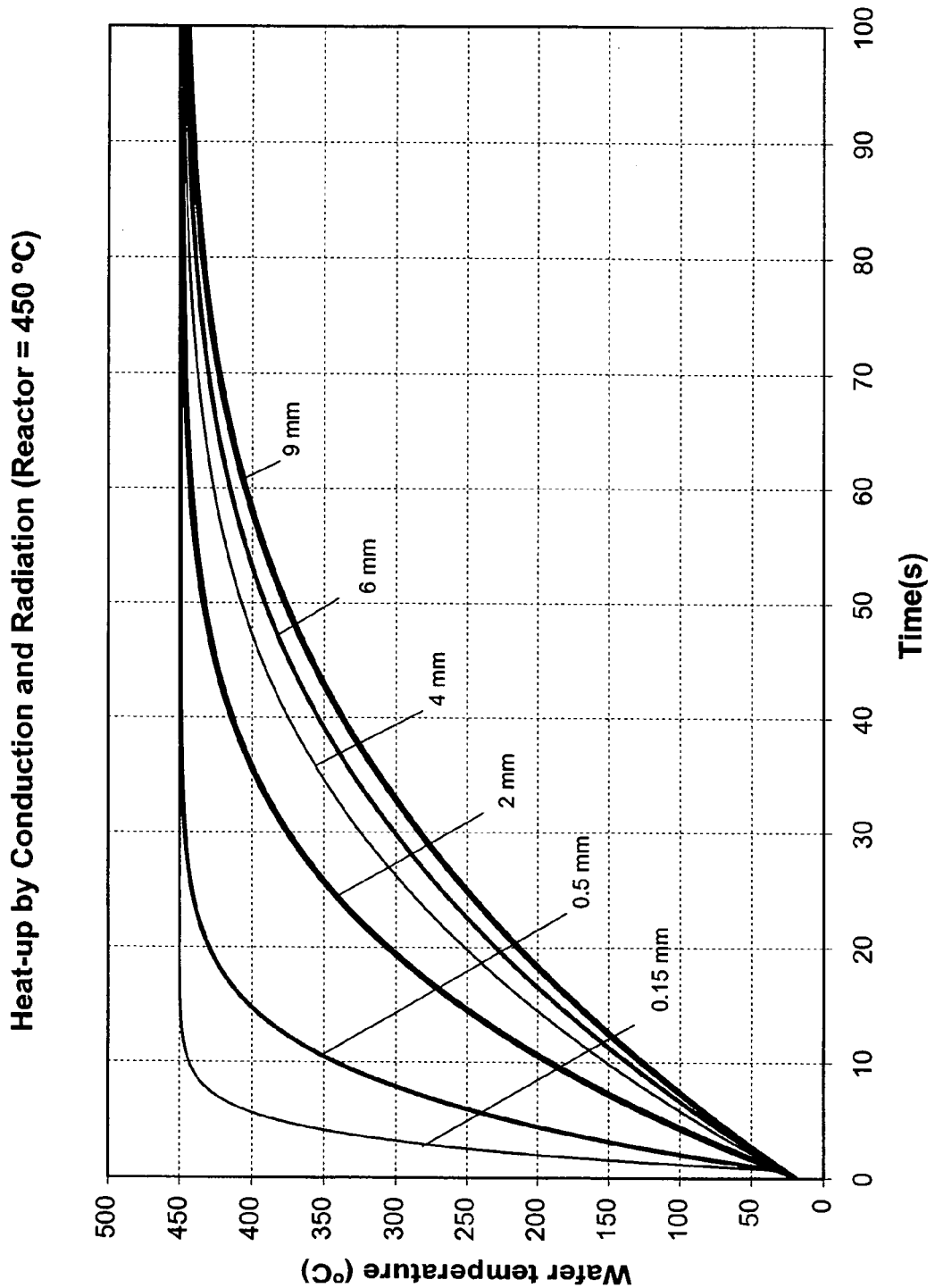
FIG. 5 shows the calculated heat-up of a substrate placed symmetrically between two reactor bodies maintained at 450° C., at various reactor body-to-substrate spacings.

In FIG. 5, the results are shown for a furnace body where the temperature has been raised to 450° C. In this case, the heat-up for large distances is somewhat faster as heat transfer by radiation is now more significant due to the higher furnace body temperature. Nevertheless, for larger distances the substrate temperature still significantly deviates from the furnace body temperature of 450° C. after 60 seconds.

Figure 6:
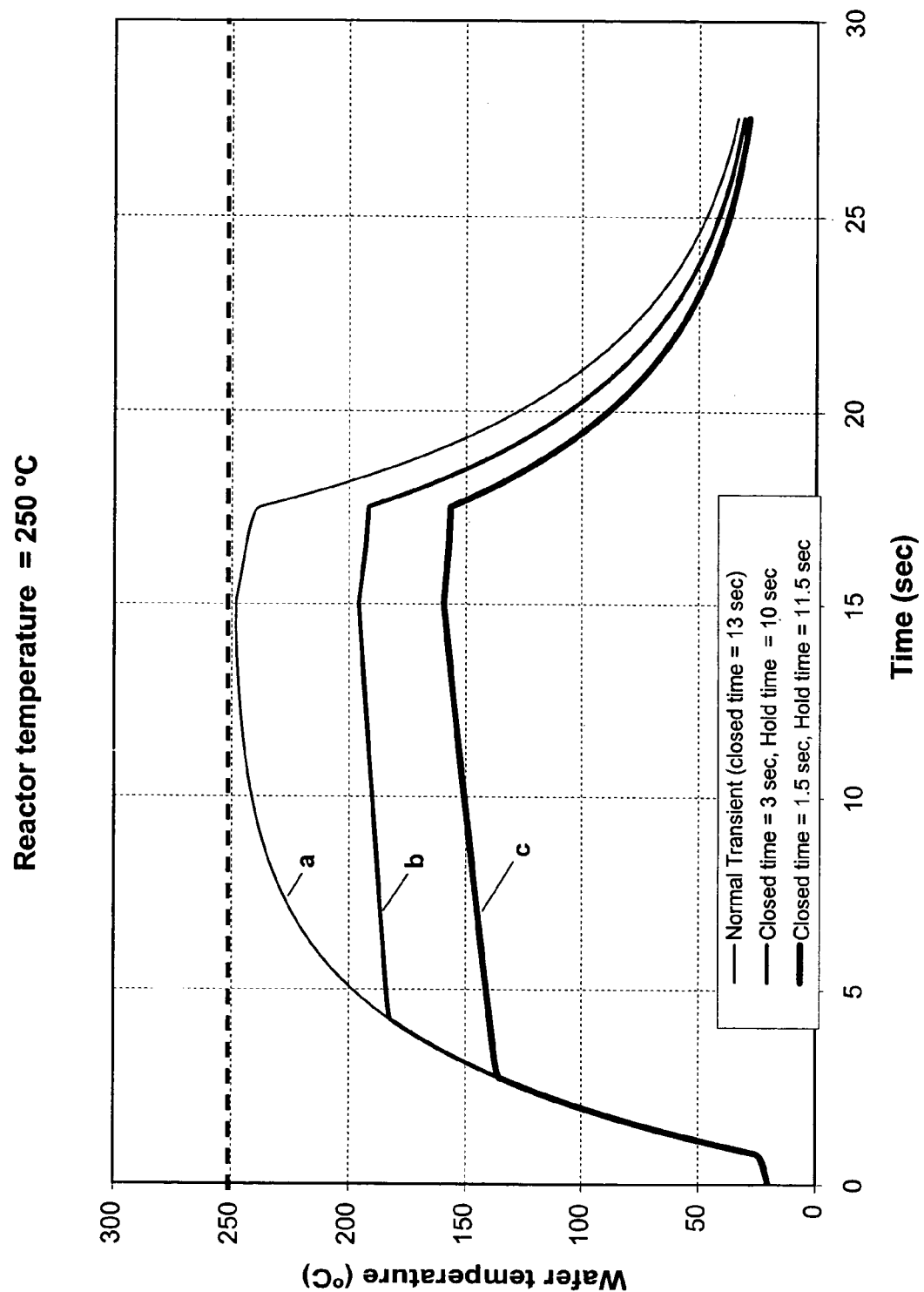
FIG. 6 shows the variations over time in thermal treatment temperature for a reactor body temperature of 250° C., under various conditions, including differing spacings for differing lengths of time.

In FIG. 6, three different heat treatment procedures are simulated for furnace bodies (FIGS. 1-3) at temperatures of 250° C. In the first, conventional procedure, indicated by Curve "a," a wafer is placed between t=0 and t=1 s in between and adjacent to the two furnace bodies, at a spacing of about 0.15 mm to each one of the furnace bodies. Then the wafer is kept in this position for 13 seconds, from t=1 to t=14 s. In the next second, from t=14 to t=15 s, the distance between the wafer and each of the furnace bodies is increased from about 0.15 mm to 9 mm by moving each one of the furnace bodies away from the wafer. Subsequently, from t=15 to t=18 s, the wafer is removed from between the furnace bodies and placed adjacent to a cooling body outside the illustrated reactor 1 (FIGS. 1-3). It can be observed from FIG. 6 that at t=14 s, the wafer has nearly assumed the temperature (within about 2° C.) of the furnace body.

In the second procedure, indicated by Curve "b," processing is performed according to the preferred embodiments. During the heat-up time, the wafer is spaced about 0.15 mm from the furnace bodies for only about 3 seconds, from t=1 to t=4 s. During these 3 seconds, the wafer heats up to about 180° C. Then, in the next second, from about t=4 to t=5 s, the distance between the wafer and each of the furnace bodies is increased to about 9 mm. The wafer and furnace bodies are held in this position for a holding time of 10 seconds, from about t=5 to t=15 s. During this additional holding time, wafer heat-up continues but is substantially slower than before and the final wafer temperature increases about 15° C. to about 195° C. Finally, the wafer is transported to the cooling body from about t=15 to t=18 s.

In the third procedure, indicated by Curve "c," processing is also performed according to the preferred embodiments. During the heat-up time, the wafer is also spaced about 0.15 mm from each of the furnace bodies. In this case, however, the heat-up has been reduced to less than 3 second, to about 1.5 seconds in this case. The holding time is increased correspondingly to less than about 12 s, to about 11.5 s, so that the sum of the heat-up time and the holding time is the same as that of the first and second procedures. For this third procedure, however, the wafer temperature after heat-up is about 135° C. and, at the end of the holding time, the wafer temperature has increased about 25° C., to about 160° C. Thus, by utilizing the preferred embodiments, the heat-up of a wafer is interrupted and a large variation in wafer process temperatures can be achieved without having to change the temperature of the furnace bodies or reactor.

Figure 7:
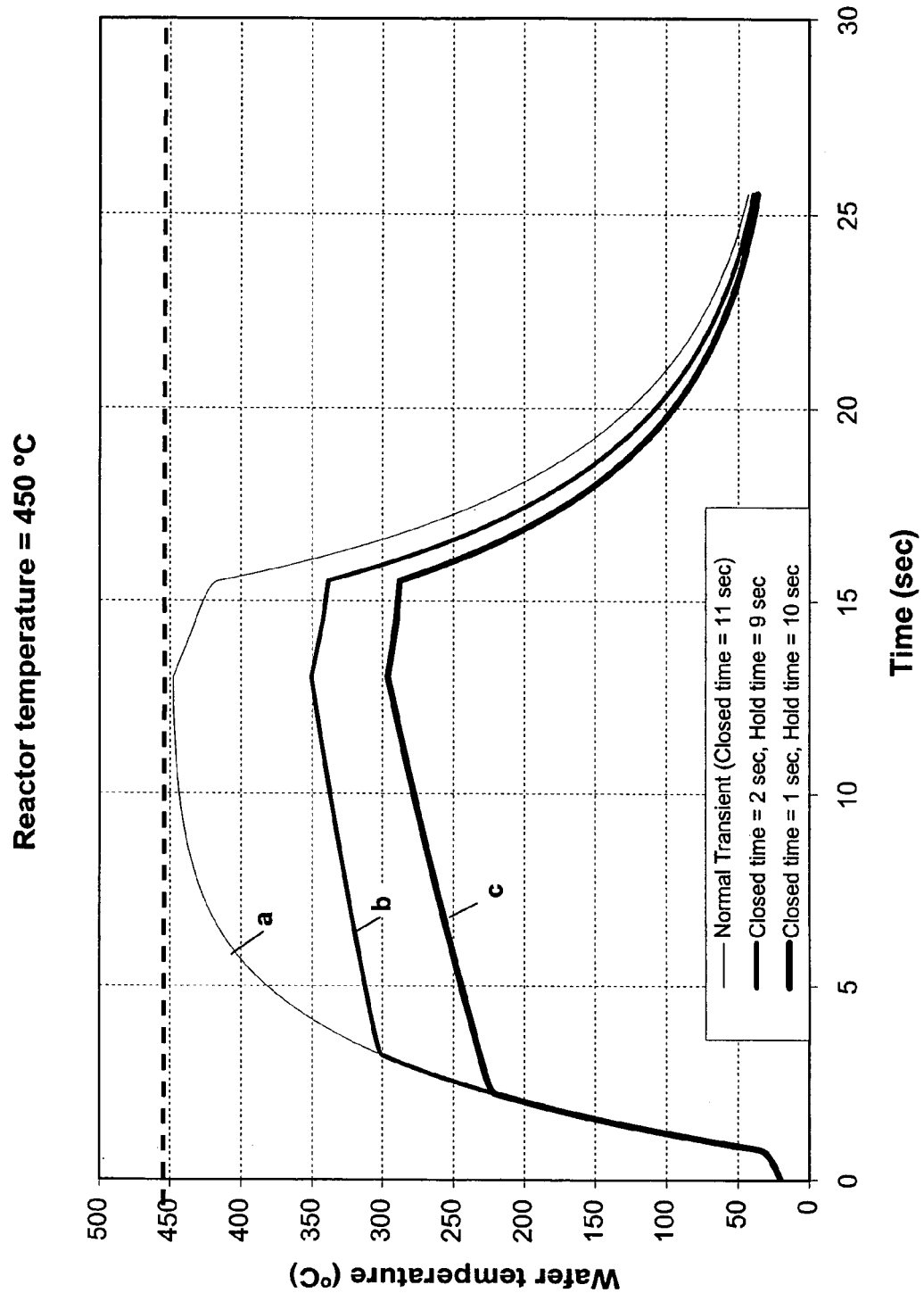
FIG. 7 shows the variations over time in thermal treatment temperature for a reactor body temperature of 450° C., under various conditions, including differing spacings for differing lengths of time.

As shown in FIG. 7, similar temperature simulations were carried out for cases where the temperature of the furnace bodies was 450° C. As in FIG. 6, Curve "a" is conventional procedure treatment procedure (where the wafer reaches a temperature within about 2° C. of the temperature of the heated bodies) and Curves "b" and "c" are treatment procedures performed according to the preferred embodiments. Again, the substrate is spaced about 0.15 mm from the nearest furnace body during the heat-up period and about 9 mm from the nearest furnace body during the holding period. Because of the higher initial temperature difference between the wafer and the furnace body, relative to the simulation represented by FIG. 6, the initial heat-up part of Curves "a," "b," and "c" is steeper than the corresponding curves of FIG. 6. Consequently, the heat-up times are advantageously reduced in order to achieve a substantial variation in wafer temperature. For example, the heat-up times have been reduced to 1 and 2 seconds for Curves "b" and "c," respectively.

In addition, during the holding times, about 9 and 10 seconds, represented by Curves "b" and "c," respectively, a relatively greater heat-up of the wafer occurs in comparison to the cases represented in FIG. 6. This is because heat transfer through radiation plays an increasingly larger role at increasingly higher furnace body temperatures, as discussed above. In this case, Curve "b" shows a rise in temperature from about 300° C. to about 350° C., an increase of about 50° C. and Curve "c" shows a rise from about 225° C. to about 300° C., an increase of about 75° C. Consequently, as furnace body temperature increases, the rise in the temperature of the substrate over the target temperature at the end of the heat-up time also increases. This trend can be ameliorated somewhat, however, by further increasing the distance between the substrate and the furnace bodies, to further decrease conductive heating of the substrate.

It will be appreciated that FIGS. 5 and 6 illustrate exemplary heating curves using exemplary temperatures, substrate to furnace body spacings, heat-up times and hold times. As such, other combinations of temperatures, substrate to furnace body spacings, heat-up times and hold times are possible. For example, the substrate can be spaced less than about 0.15 mm from the furnace bodies during the heat-up time or more than about 9 mm from the furnace bodies during the hold time. Preferably, however, the substrate is spaced less than about 2 mm and, more preferably, less than about 1 mm from the furnace bodies during the heat-up time. In addition, the substrate is preferably spaced more than about 2 mm and, more preferably, more than about 4 mm during the hold time. Moreover, the relatively high temperature of the heated bodies advantageously allow rapid heating of the substrate, such that the substrate can be heated to a desired temperature in less than about 3 seconds, while the reduced transfer of heat between the substrate and the heated bodies allows for processing at roughly the desired temperature, e.g., for about 5 seconds or more and, more preferably, about 8 seconds or more.

Figure 8:
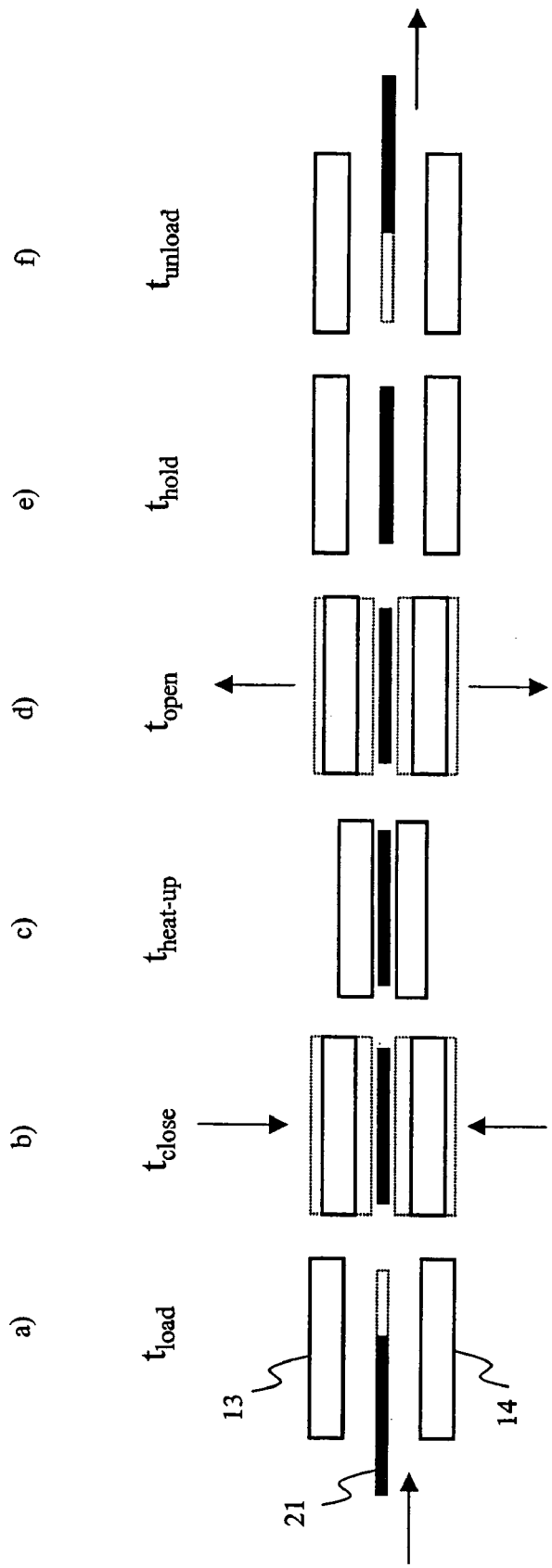
FIG. 8 shows, schematically, the sequence of events in an exemplary thermal treatment process, in accordance with preferred embodiments of the invention.

A sequence of events in an exemplary embodiment of the invention is shown schematically in FIG. 8, steps a) through f). In step a), the substrate 21 is loaded in between upper block 13 and lower block 14, the loading taking a time $t_{load}$. During loading, blocks 13 and 14 are preferably in an open position for receiving the substrate. In step b), the blocks 13 and 14 are moved towards each other from the open position to a closed position, the movement to the closed position taking a time $t_{close}$. Then the blocks remain in the closed position during a time $t_{heat-up}$, during which rapid heat-up of the substrate occurs, as shown in step c). According to the preferred embodiments, the heat-up time $t_{heat-up}$ should be selected to be short enough such that at the end of that time the substrate temperature is still substantially lower, e.g., by less than about 10° C., than the block temperature, as discussed above. After the heat-up time has elapsed, the blocks are moved away from each other to the open position again, taking a time $t_{open}$, as shown in 8d). The substrate is kept in this position for a time $t_{hold}$, as shown in step e). Finally, the substrate is removed from between the blocks, the removal taking a time $t_{unload}$, as shown in step 8f).

It will be appreciated that any of various methods known in the art can be utilized to transport a substrate into the reactor 1. For example, the substrate can be transported by a support arm that places the substrate between the furnace bodies 130, 140 and then retracts from between the furnace bodies 130, 140.

In other arrangements, a substrate can be transported between furnace bodies and the support arm, or parts of the support arm can remain between the furnace bodies. In such arrangements, the design of the furnace bodies can be optimized for optimum temperature uniformity over the substrate.

Figure 9:
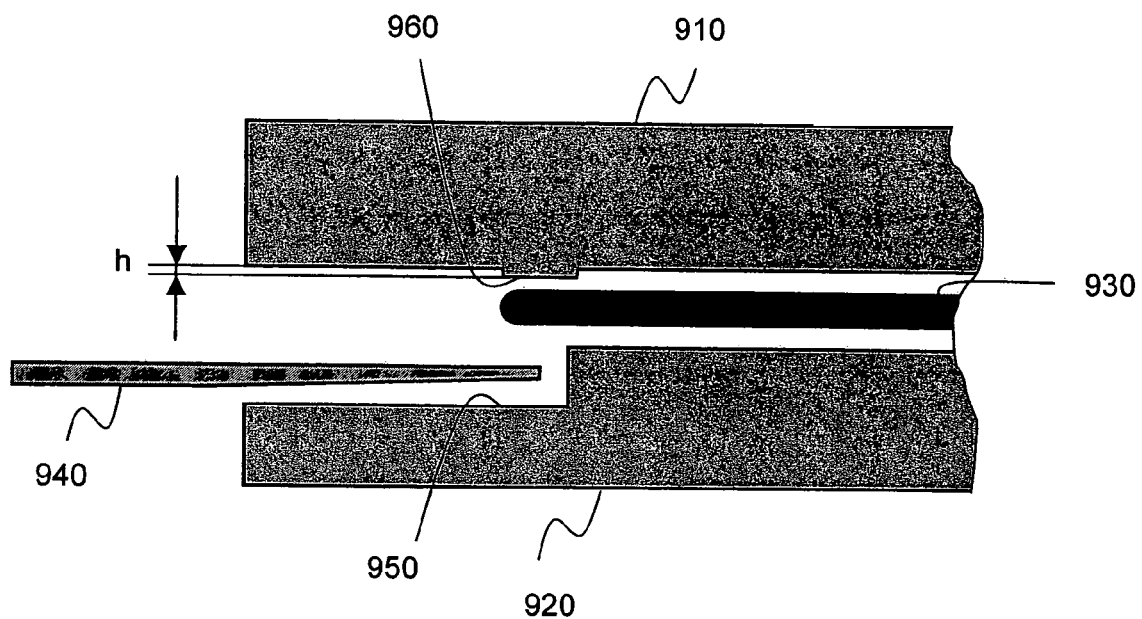
FIG. 9 shows, schematically, an exemplary floating substrate reactor in which parts of an arm for transporting a substrate remain in the reactor during processing.

For example, in one exemplary embodiment, with reference to FIG. 9, a Levitor® reactor having two furnace bodies 910, 920, configured for accommodating a substrate 930 therebetween is shown schematically. Preferably, the furnace bodies 910, 920 are massive and the surfaces of the furnace bodies 910, 920 facing the substrate 930 are as perfectly planar as possible. However, during transport of the substrate 930 towards the furnace bodies 910, 920, the substrate 930 is mechanically supported by the support fingers 940. During processing, these fingers 940 are accommodated into recesses 950 in the lower furnace body 920. At the position of the recesses 950, heat transport toward the substrate 930 by conduction is locally limited due to the relatively large distance between the surfaces of the furnace bodies 910, 920 and the substrate 930. Advantageously, this can be at least partly compensated for by providing elevated areas 910 in the furnace body 910 opposing the furnace body 920 having the recess 950, the elevated areas 910 located at locations corresponding to the recesses 950. Because of the elevated areas 960, the distance between the substrate 930 and upper furnace body 910 locally decreases, resulting in locally increased heat transfer from the upper furnace body 910 to the substrate 930. In one example, the distance between substrate 930 and the main surface of the furnace body 910 during processing is about 0.15 mm and the height h of the elevated area 960 is between about 0.05 and 0.10 mm. Preferably, the lateral sizes of the elevated areas approximately match with the sizes of the portions of the recesses overlapped by the wafer 930.

EXAMPLE

A silicidation process involving two anneals was carried out. The first anneal of these two anneals was carried out according to either a conventional anneal or to an anneal according to the methods described herein and the results for these two anneals were compared.

In the conventional first anneal, silicon wafers having a nickel (Ni) film on their top surface received an anneal in a Levitor® reactor, commercially available from ASM International, N.V. of Bilthoven, The Netherlands, with the reactor blocks and furnace bodies at a constant temperature of 350° C. The blocks remained in the closed position, with the wafer at a distance of 0.15 mm from each of the reactor blocks, for 18 seconds.

In the first anneal according to the methods described herein, similar silicon wafers received an anneal in the Levitor® reactor with the reactor blocks and furnace bodies set at a temperature of 450° C. After introducing the wafer into the reactor, the blocks remained in the closed position for 2.6 seconds, which, according to the above described temperature simulations, should give a wafer temperature of about 340° C. Then the blocks were moved away from each other so that the distance between the wafer and each of the blocks was 9 mm and the wafer was kept in this condition for a holding time of 5 seconds.

During the first anneal of the wafers $Ni_2Si$ is formed in those areas where the Ni is in contact with silicon. After this step, in a typical Integrated Circuit fabrication process, unreacted Nickel is selectively removed from the wafer by an etching process, leaving a pattern of $Ni_2Si$ on the wafer in the areas where the silicon was exposed to Ni. After selective removal of unreacted Ni a second anneal is carried out to form low resistivity NiSi. In this example, a second anneal was carried out in the Levitor® reactor at 450° C. for 40 seconds. It will be appreciated that the second anneal can be carried out in the same reactor as the first anneal or it can be carried out in a different, but similarly configured, reactor.

After the second anneal, the sheet resistance was 7.5 Ohm/sq. for the wafer that received a conventional first anneal and 7.7 Ohm/sq. for the wafer that received the first anneal according to the methods described herein. The similarity in these results indicates that the methods disclosed herein are an effective substitute for the conventional anneal and allow the performance of a thermal treatment where the temperature specified for the treatment is less than the temperature set-point of the reactor.

It will be appreciated that other combinations of heat-up times and hold times can be utilized to arrive at similar results. In addition, as noted above, rather than using two reactors set at two different temperatures, the same reactor can be used for both the first and the second anneals, with the reactor blocks and furnace bodies set at the temperature of the higher temperature anneal. It will also be appreciated that the substrate can be removed from the reactor for other processing, e.g., for film deposition on the substrate or a patterning process, in the time between the first and the second anneals, and the second anneal can be performed on a physically different wafer.

Moreover, in other process sequences, rather than performing two anneals on one wafer, the same reactor can be used to process different wafers requiring different anneal temperatures, so that the first process or process step can be carried out on one wafer, while the second process or process step can be carried out on a different wafer undergoing a different process sequence. Furthermore, the described reactor is capable of thermal treatments beyond simple annealing, such as chemical vapor deposition (CVD).

Although the preferred embodiments have been described with a substrate floatingly supported by gas streams between two furnace bodies during the heat-up and hold times, the embodiments of the invention are not limited to such as arrangement. For example, in other embodiments, the wafer can be mechanically supported during the treatment. Thus, in some embodiments, during the heat-up time, the wafer can be supported on a furnace body or on support structures such as pins and during the hold time the wafer may be supported spaced from the furnace body on support structures also. In addition, the wafer can be heated using only one furnace body and/or, during the hold time, the distance between the substrate and one furnace body can be different from the distance of the substrate to the other furnace body.

Moreover, various other arrangements are possible for lowering the amount of heat transferred from the furnace body or bodies. For example, instead of varying the distance between the substrate and the furnace bodies to change the heat transfer between the substrate and the furnace bodies, the distance may be kept constant and the gas between the substrate and the furnace bodies can be varied. In some embodiments, during heat-up a high conduction gas, such as He or $H_2$, can be used and during the hold time a lower conduction gas, such as $N_2$ or Ar, can be used. It will be appreciated that the difference in thermal conduction between He and $N_2$ is a factor of about 10. In other embodiments, the distance between the substrate and the furnace body or bodies can be increased and the lower conduction gas can be used during the hold time to reduce heat conduction. Advantageously, such embodiments can further reduce the heating that occurs during the hold time and are particularly advantageous for minimizing further substrate heating in relatively high temperature situations such as that represented in FIG. 7.

In addition, it will be appreciated that, while illustrated with two heated furnace bodies, only one heated furnace body need be provided or heated. In such cases, heating is principally due to heat transfer from the single heated body and varying the heat transfer between the single heated body and the substrate varies the temperature of the substrate.

Also, rather than lowering the heat transfer to a substrate after the heat-up time, in an alternative application, the heat transfer can be increased after the heat-up time. This can be performed by applying a first spacing between the substrate, e.g., a wafer, and each of the furnace bodies during an initial heat-up period, and then a second spacing after the initial heat-up, wherein the second spacing is smaller than the first spacing. Alternatively, the heat transfer can be varied by changing the heat conduction of the gas between the wafer and each of the furnace bodies, having a gas with a first heat conduction during an initial heat-up period and a gas with a second heat conduction after the initial heat-up period, wherein the second heat conduction is greater than the first heat conduction.

Figure 10:
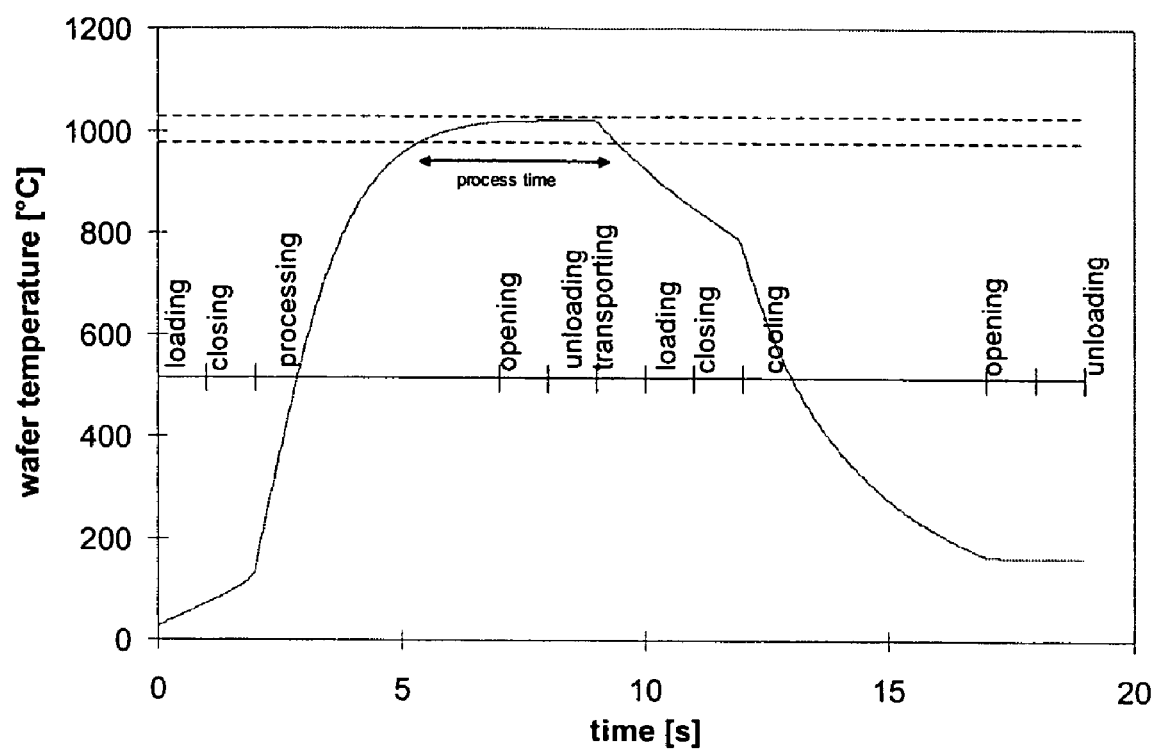
FIG. 10 shows a profile of wafer temperature over time, wherein nitrogen gas is flowed between reactor bodies and the wafer.
Figure 11:
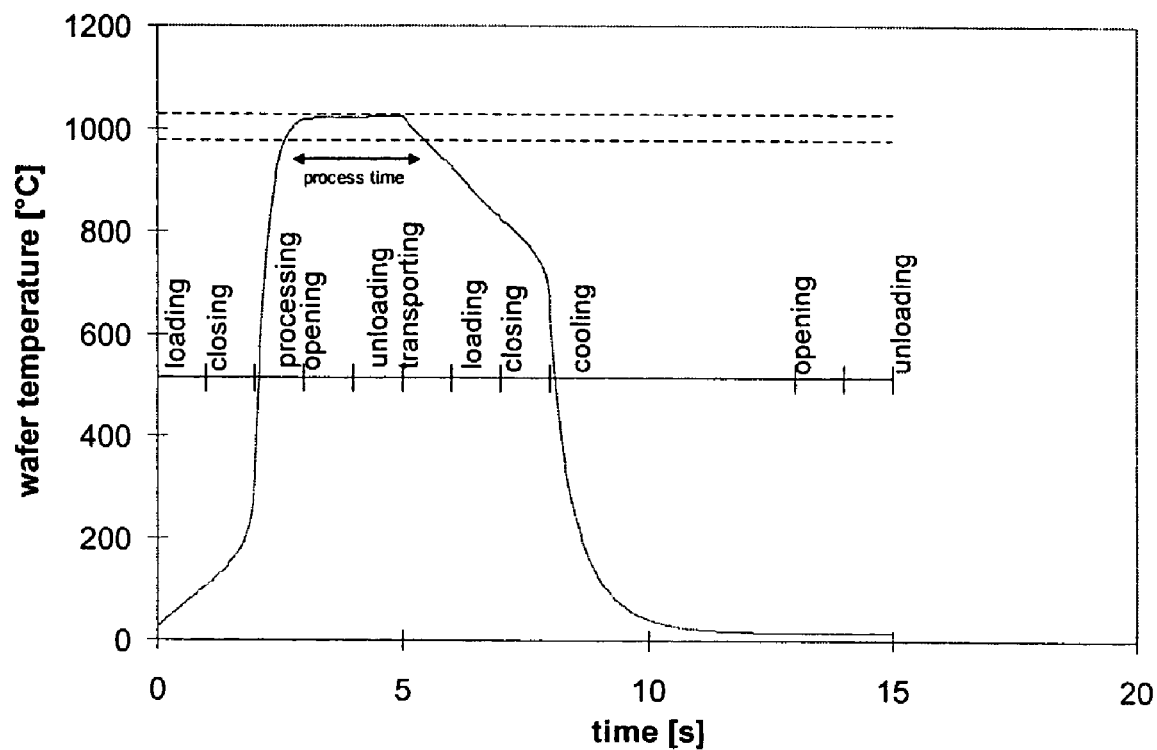
FIG. 11 shows a profile of wafer temperature over time, wherein helium gas is flowed between reactor bodies and the wafer.
Figure 12:
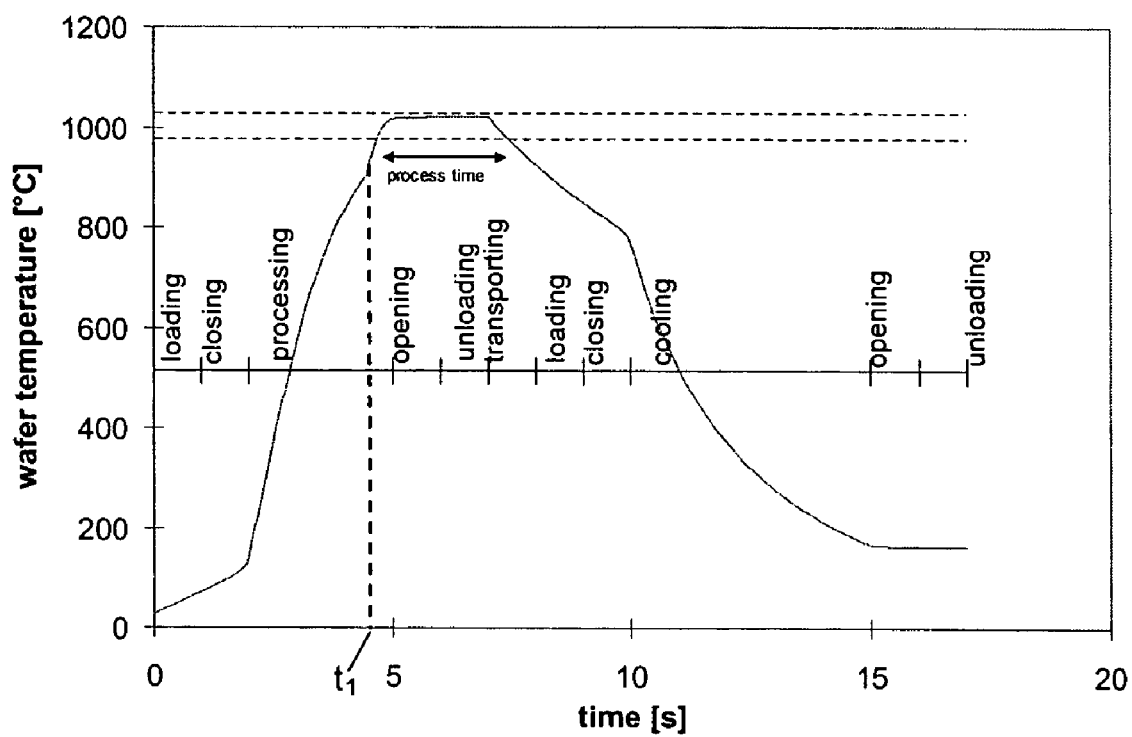
FIG. 12 shows a profile of wafer temperature over time, wherein the gas flowed between reactor bodies and the wafer is initially nitrogen gas, which is then switched to helium gas at $t=t_1$.

In FIGS. 10, 11 and 12 this alternative application is explained in further detail. The results of these figures were obtained by simulation. FIG. 10 shows an exemplary wafer temperature-time profile in which the furnace bodies are at about 1000° C. and nitrogen gas is flowed between the furnace bodies and the wafer. FIG. 11 shows an exemplary wafer temperature-time profile in which helium has is flowed between the furnace bodies and the wafer. Helium has a higher thermal conductivity than nitrogen and, consequently, in FIG. 11 a steeper heat-up can be observed than in FIG. 10. However, the heat-up can be so fast that damage to the wafer and/or to the furnace bodies occurs. This may be particularly true in the low temperature region since the heat transfer mechanism is conduction, which results in a heat flow that is proportional to the temperature difference between the furnace bodies and the wafer. Consequently, initially, when the wafer is close to room temperature, the temperature difference is large, resulting in a large heat flow, a fast heat-up and a large thermal shock. The resistance of the furnace bodies against thermal shocks depends on the material of the furnace bodies: furnace bodies of graphite and quartz are better able to withstand thermal shocks than furnace bodies made of silicon carbide.

FIG. 12 shows an exemplary wafer temperature-time profile, in which nitrogen gas is flowed between the furnace bodies and the wafer during the initial heat-up. At $t=t_1$ the nitrogen gas is replaced by helium, resulting in an increase of the heat-up rate. In most cases, when a spike anneal is required, the upper part of the spike determines the thermal budget and process performance. The part of the profile having a temperature of about 100° C. or more below the peak temperature of the spike does not have a significant influence. According to this method, the wafer can be subjected to a sharp spike anneal at high temperature, while avoiding problems, e.g., large thermal shocks, at lower temperatures.

Accordingly, it will be appreciated by those skilled in the art that other various omissions, additions and modifications can be made to the processes described above without departing from the scope of the invention. All such modifications and changes are intended to fall within the scope of the invention, as defined by the appended claims.

We claim:

1. A heat treatment apparatus for processing a substrate, comprising:

two furnace bodies disposed opposite each other and separated by a separation distance, each furnace body having a boundary surface positioned to face a substrate upon retention of the substrate therebetween, wherein the furnace bodies are movable relative to each other; and one or more heaters configured to heat each furnace body, wherein the apparatus is configured to maintain the substrate at a temperature below temperatures of the furnace bodies during an entire time the substrate is retained between the furnace bodies and wherein the apparatus is configured to maintain the substrate at a first temperature for a first holding period and to maintain the substrate at a second temperature for a second holding period.

2. A heat treatment apparatus for processing a substrate, comprising:

two furnace bodies disposed opposite each other and separated by a separation distance, each furnace body having a boundary surface positioned to face a substrate upon retention of the substrate therebetween, wherein the furnace bodies are movable relative to each other; and one or more heaters configured to heat each furnace body, wherein the apparatus is configured to maintain the substrate at a temperature below temperatures of the furnace bodies during an entire time the substrate is retained between the furnace bodies and wherein the apparatus is configured to maintain the substrate spaced from the furnace bodies at a first set of distances during an initial heat up time and to increase the distances between the substrate and the furnace bodies during a subsequent holding time.

3. The apparatus of claim 2, wherein the apparatus is configured to float the substrate on a gas cushion between the furnace bodies.

4. The apparatus of claim 2, wherein the temperature of the substrate is about 20° C. or more less than the temperatures of the furnace bodies during the time the substrate is retained between the furnace bodies.

5. The apparatus of claim 2, wherein the temperatures of the two second furnace bodies are the same.

6. The apparatus of claim 2, configured to space the substrate from the furnace bodies at less than about 2 mm during the heat up time and at more than about 2 mm during the holding time.

7. The apparatus of claim 6, configured to space the substrate from the furnace bodies at less than about 1 mm during the heat up time.

8. The apparatus of claim 7, configured to space the substrate from the furnace bodies at more than about 4 mm during the holding time.

9. The apparatus of claim 2, wherein the substrate is a semiconductor substrate.

10. A heat treatment apparatus for processing a substrate, comprising:
    two furnace bodies disposed opposite each other and separated by a separation distance, each furnace body having a boundary surface positioned to face a substrate upon retention of the substrate therebetween, wherein the furnace bodies are movable relative to each other; and
    one or more heaters configured to heat each furnace body, wherein the apparatus is configured to maintain the substrate at a temperature below temperatures of the furnace bodies during an entire time the substrate is retained between the furnace bodies and wherein the apparatus is in gas communication with a source of a low thermal conductivity gas and a source of a high thermal conductivity gas, wherein the apparatus is configured to supply a low thermal conductivity gas and a high thermal conductivity gas between the substrate and the furnace bodies.

11. The apparatus of claim 10, configured to first supply the high thermal conductivity gas between the substrate and the furnace bodies and subsequently to supply the low thermal conductivity gas between the substrate and the furnace bodies.

12. A heat treatment apparatus for processing a plurality of substrates one at a time, comprising:
    two furnace bodies, the furnace bodies opposite each other and separated by a separation distance, each furnace body having a boundary surface oriented to face a substrate upon positioning of the substrate in the heat treatment apparatus for heat treatment, wherein the furnace bodies are movable relative to each other; and
    heaters associated with and configured to heat each furnace body during substrate treatment,
    wherein the apparatus is configured to heat a substrate to a first substrate treatment temperature or a second substrate treatment temperature, wherein the heaters have a substantially constant temperature set-point during treatment whether the substrate is heated to the first treatment temperature or the second treatment temperature.

13. The apparatus of claim 12, wherein each of the furnace bodies is independently movable.

14. The apparatus of claim 12, wherein the one or more heaters are configured to heat the furnace bodies to the same temperature.

15. The apparatus of claim 12, configured to maintain the first and the second treatment temperatures at less than the furnace body temperature of each furnace body by about 20° C. or more.

16. The apparatus of claim 12, configured to move the furnace bodies to each of three positions:
    a moved apart position for introducing or removing a substrate therebetween;
    a closed position during a heat-up time after introducing a substrate, wherein the distance between the substrate and each of the furnace bodies is less than 2 mm in the closed position; and
    a hold position after heat-up of the substrate, wherein the distance between the wafer and each of the furnace bodies is greater in the hold position than in the closed position.

17. The apparatus of claim 16, configured to hold the furnace bodies in the closed position for a time period selected based upon: a temperature of each of the furnace bodies; a distance between the substrate and each of the furnace bodies in the closed position; and a desired treatment temperature.

18. The apparatus of claim 17, wherein the desired treatment temperature is a highest temperature of the substrate while retained between the furnace bodies, wherein the time period the furnace bodies are held in the closed position is selected to maintain the temperature of the substrate below the temperatures of each of the furnace bodies.

19. The apparatus of claim 12, configured to float the substrate between the furnace bodies on a gas cushion.

20. A heat treatment apparatus for processing a plurality of substrates one at a time, comprising:
    two furnace bodies, the furnace bodies opposite each other and separated by a separation distance, each furnace body having a boundary surface oriented to face a substrate upon positioning of the substrate in the heat treatment apparatus for heat treatment, wherein the furnace bodies are movable relative to each other; and
    heaters configured to heat each furnace body during an initial substrate heat-up period and a subsequent substrate holding time, wherein each furnace body is provided with an associated heater,
    wherein the apparatus is configured to establish a first heat transfer rate between each of the furnace bodies and the substrate during the initial heat-up period and a second heat transfer rate between each of the furnace bodies and the substrate during the subsequent holding time, wherein the heater has a substantially constant temperature set-point during treatment.

21. The apparatus of claim 20, wherein the one or more heaters are configured to heat the furnace bodies to the same temperature.

22. The apparatus of claim 20, wherein the second heat transfer rate is lower than the first heat transfer.

23. The apparatus of claim 22, configured to maintain the substrate spaced from the furnace bodies at a first set of distances during the initial heat-up period and to increase the distances between the substrate and the furnace bodies during the subsequent holding time.

24. The apparatus of claim 22, configured to supply a high thermal conductivity gas between the substrate and the furnace bodies during the initial heat-up period and to supply a low thermal conductivity gas during the subsequent holding time.

25. The apparatus of claim 20, wherein the second heat transfer rate is higher than the first heat transfer.

26. The apparatus of claim 25, configured to maintain the substrate spaced from the furnace bodies at a first set of distances during the initial heat-up period and to decrease the distances between the substrate and the furnace bodies during the subsequent holding time.

27. The apparatus of claim 25, configured to supply a low thermal conductivity gas between the substrate and the furnace bodies during the initial heat-up period and to supply a high thermal conductivity gas between the substrate and the furnace bodies during the subsequent holding time.

* * * * *